United States Patent
Iida et al.

[11] Patent Number: 5,948,164
[45] Date of Patent: Sep. 7, 1999

[54] SEED CRYSTAL HOLDER

[75] Inventors: Makoto Iida; Eiichi Iino; Masanori Kimura; Shozo Muraoka, all of Gunma-ken, Japan

[73] Assignee: Shin Etsu Handotai Co., Ltd., Tokyo, Japan

[21] Appl. No.: 09/140,288

[22] Filed: Aug. 25, 1998

[30] Foreign Application Priority Data

Sep. 2, 1997 [JP] Japan .................................. 9-252749

[51] Int. Cl.$^6$ .................................................. C30B 35/00
[52] U.S. Cl. ........................ 117/218; 117/200; 117/900; 117/911
[58] Field of Search .................... 117/200, 218, 117/900, 911

[56] References Cited

U.S. PATENT DOCUMENTS

| | | | |
|---|---|---|---|
| 3,923,468 | 12/1975 | Keller | 117/932 |
| 4,350,560 | 9/1982 | Hehgehand et al. | 117/35 |
| 4,594,127 | 6/1986 | Hehgehand et al. | 117/35 |
| 5,234,664 | 8/1993 | Drechsel | 114/218 |

FOREIGN PATENT DOCUMENTS

| | | |
|---|---|---|
| 0488785 | 6/1992 | European Pat. Off. . |
| 0866151 | 9/1998 | European Pat. Off. . |
| 8711063 | 1/1988 | Germany . |
| 4123337 | 1/1993 | Germany . |
| 56-037294 | 4/1981 | Japan . |
| 59-131596 | 7/1984 | Japan . |
| 59-174594 | 10/1984 | Japan . |
| 60-239390 | 11/1985 | Japan . |
| 62-212291 | 9/1987 | Japan .............................. C30B 15/32 |
| 63-288987 | 11/1988 | Japan . |
| 9249488 | 1/1998 | Japan . |

*Primary Examiner*—Felisa Hiteshew
*Attorney, Agent, or Firm*—Loeb & Loeb LLP

[57] ABSTRACT

A seed crystal holder used in a crystal pulling apparatus operated in accordance with the Czochralski method. In the seed crystal holder, a heat-resistant cushioning material is provided between the surface of a seed crystal and the contact surface of claws of the holder or between a cutaway surface of the seed crystal and a contact surface of an insert of the holder. The heat-resistant cushioning material is selected from the group consisting of carbon fiber felt, glass fiber felt, metallic fiber felt, or selected from materials that cause plastic deformation such as Al.

4 Claims, 3 Drawing Sheets

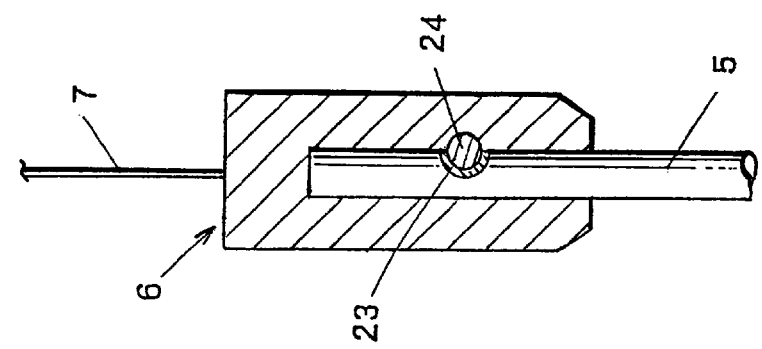
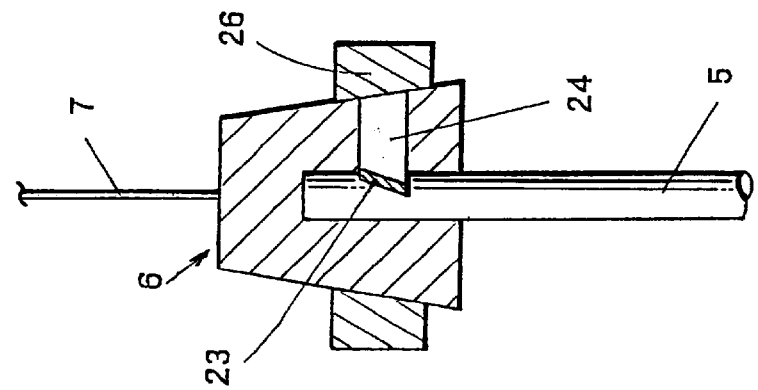
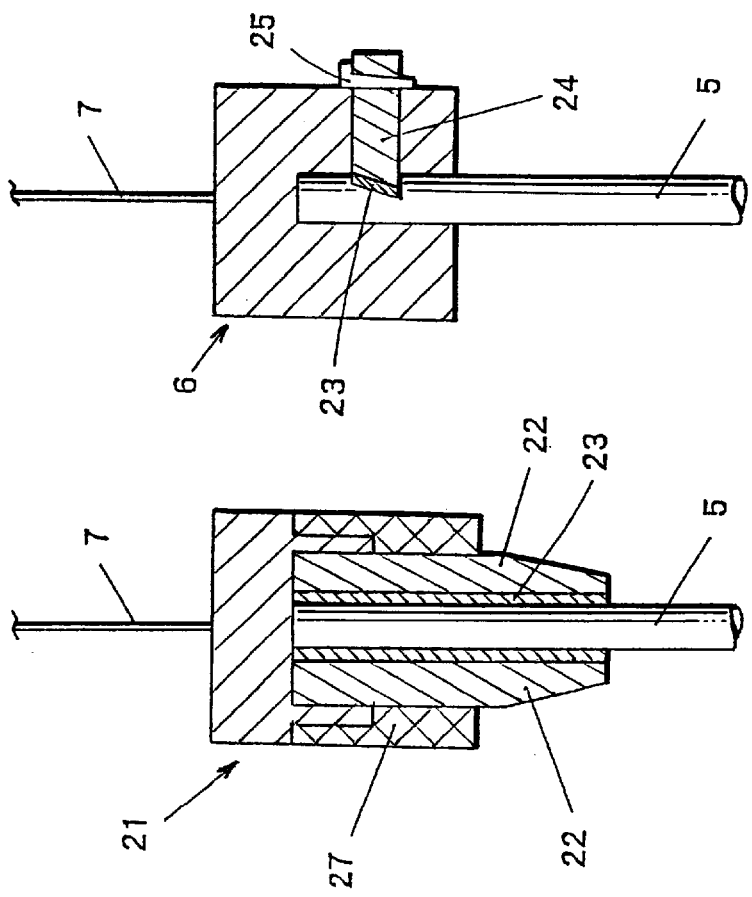
FIG. IA  FIG. IB  FIG. IC  FIG. ID

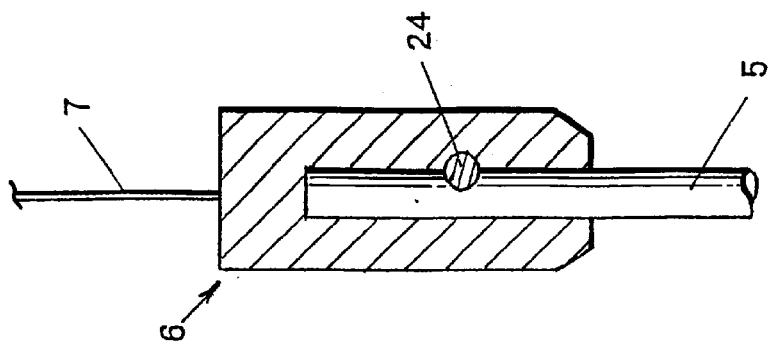
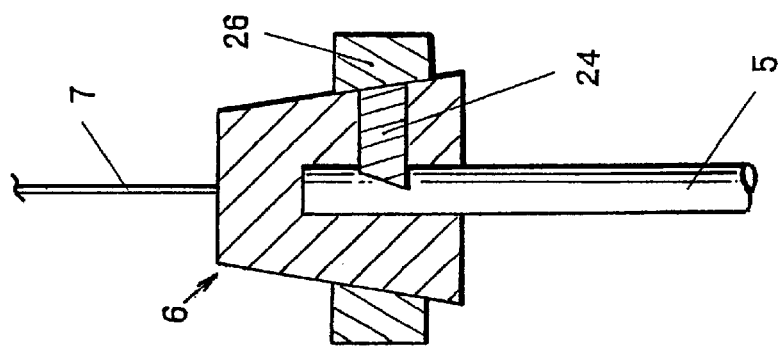
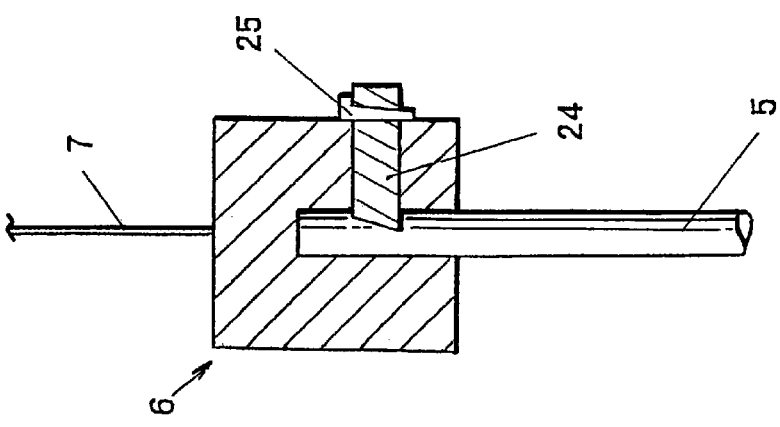
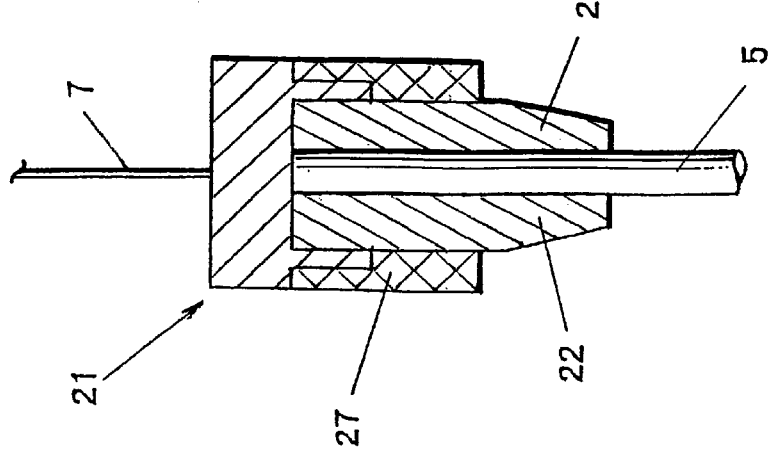

SEED CRYSTAL HOLDER

BACKGROUND OF THE INVENTION

1. Field of the Invention

The present invention relates to an improvement on a seed crystal holder used in a crystal pulling apparatus for manufacturing a variety of crystal materials such as semiconductors, dielectrics, and magnetic materials in accordance with the Czochralski method.

2. Description of the Related Art

Conventionally, a single-crystal material such as a semiconductor silicon single crystal has been manufactured as a bar-shaped crystal in accordance with the Czochralski (CZ) method.

An example of a crystal pulling apparatus used in the CZ method is given in FIG. 3. The crystal pulling apparatus 20 shown in FIG. 3 comprises a crucible 3 disposed within a chamber 10 and adapted to contain a silicon melt 2; a crucible support shaft 4 and an unillustrated rotation mechanism for supporting and rotating the crucible 3; a seed crystal holder 6 for holding a seed crystal 5; a wire 7 for pulling the seed crystal holder 6 upward; and an unillustrated winding mechanism for rotating or winding the wire 7. The crucible 3 is surrounded by a heater 8, which is further surrounded by a heat-insulating cylinder 9.

Next, a method for growing a single crystal by use of the above-described crystal pulling apparatus 20 will be described.

First, within the crucible 3, polycrystalline silicon is heated to at least its melting point so as to be melted. Then, the wire 7 is unwound so that a tip of the seed crystal 5 is brought into contact with or dipped in the center of the melt 2. Subsequently, the crucible 3 is rotated in a proper direction, and the wire 7 is wound while being rotated so as to pull the seed crystal 5 upward. Thus, single-crystal growth starts. Through proper control of the speed of pulling and the temperature of the melt, a single crystal 1 having a substantially cylindrical shape can be obtained.

For the seed crystal holder 6 for holding the seed crystal 5 in the CZ method, there have been proposed and put into practical use various seed crystal holders having different structures, which are basically classified into two types: 1) a chuck type as shown in FIG. 2A, and 2) a key-lock type as shown in FIGS. 2B, 2C, and 2D. In the chuck-type seed crystal holder as shown in FIG. 2A, the seed crystal 5 is held by means of a plurality of claws 22 that open and close as the outer sleeve 27 rotates. In the seed crystal holder 6 shown in FIG. 2B, the seed crystal 5 is inserted into a bore formed at the center of the holder body; an insert 24 is inserted into the body from a side thereof so that the insert 24 comes into contact with a slanted cutaway surface of the seed crystal 5; and a key 25 is then inserted into the insert 24 so as to lock the insert. The seed crystal holder 6 shown in FIG. 2C is an improved type of the seed crystal holder shown in FIG. 2B. In the seed crystal holder 6 shown in FIG. 2C, the insert 24 is locked through use of a ring 26 having a tapered inner surface. That is, the ring 26 is fitted onto the tapered holder body of the seed crystal holder 6 from above in order to lock the insert. In the seed crystal holder shown in FIG. 2D, the seed crystal 5 is inserted into a bore formed at the center of the holder body of the cylindrical seed crystal holder 6; and an insert (pin) 24 is inserted from a side with respect to the seed crystal 5 so that the seed crystal 5 is engaged with the seed crystal holder 6.

In conventional seed crystal holders as described above, the surface roughness of a seed crystal is not always identical with that of the seed crystal holder, particularly that of the insert. Also, even when a seed crystal is engaged with and held by the seed crystal holder, there may be slight play between the contact surfaces of the seed crystal and the seed crystal holder. Thus, contact is established not through the entire contact surfaces (hereinafter referred to as "full-surface contact"), but through a single point (hereinafter referred to as "point contact"), so that load is concentrated at one point. In such a state, it is very difficult to safely hold and pull a single crystal being grown below a seed crystal and having a large diameter and weight. In extreme cases, cracks may be generated in a seed crystal holder at a point where load stress is concentrated, resulting in breakage of the seed crystal holder, or breakage of the seed crystal itself, thereby causing the single crystal being pulled to fall down or drop into a silicon melt contained in the crucible. Also, when the same seed crystal is used repeatedly after etching or cleaning, the risk of the seed crystal being broken increases with the number of repetitions.

SUMMARY OF THE INVENTION

The present invention has been accomplished to solve the above-mentioned problems, and the object of the present invention is to provide a seed crystal holder in which full-surface contact is established between a seed crystal holder and a seed crystal, throughout the growth of a single crystal, in order to prevent concentration, at one point, of a heavy load exerted by the weight of the single crystal being grown, thereby enabling the seed crystal to be held safely and reliably.

To achieve the above object, the present invention provides a seed crystal holder used in a crystal pulling apparatus operated in accordance with the Czochralski method, wherein a heat-resistant cushioning material is provided between the surface of a seed crystal and the contact surface of claws of the holder or between a cutaway surface of the seed crystal and a contact surface of an insert of the holder.

When the seed crystal holder is of a chuck type, the heat-resistant cushioning material is provided between the surface of a portion of a seed crystal inserted into the chuck and the inner surfaces of the plurality of claws of the chuck. When the claws are gradually closed or tightened, full-surface contact is established between the surface of the seed crystal and the inner surfaces of the claws of the chuck, so that stress acting on the seed crystal is dispersed. Also, since the surface contact is established under pressure, the contact area increases. Thus, the seed crystal can be held safely and reliably, and the single crystal being grown can be pulled stably.

In a so-called key-lock-type seed crystal holder as well, heat-resistance cushioning material is provided between the cutaway surface of the seed crystal and the contact surface of the insert of the holder. Therefore, after insertion and lock of the insert, full-surface contact is established between the cutaway surface of the seed crystal and the contact surface of the insert of the holder, so that stress acting on the seed crystal is dispersed. Also, since the surface contact is established under pressure, the contact area increases. Thus, the seed crystal can be held safely and reliably, and the single crystal being grown can be pulled stably.

Preferably, the aforementioned heat-resistant cushioning material is selected from the group consisting of carbon fiber felt, glass fiber felt, metallic fiber felt, and ceramic fiber felt. Preferably, the ceramic fiber contained in the ceramic fiber felt is selected from the group consisting of SiC fiber, BN fiber, $Si_3N_4$ fiber, AlN fiber, $Al_2O_3$ fiber, boron fiber, and silica-alumina fiber. Preferably, the heat-resistant cushioning material is selected from materials causing plastic deformation.

When the heat-resistant cushioning material is selected from the group consisting of carbon fiber felt, glass fiber felt, metallic fiber felt, and ceramic fiber felt, and the ceramic fiber contained in the ceramic fiber felt is selected from the group consisting of SiC fiber, BN fiber, $Si_3N_4$ fiber, AlN fiber, $Al_2O_3$ fiber, boron fiber, and silica-alumina fiber, the heat-resistant cushioning material is endowed with high heat-resistance, and is capable of retaining its cushioning properties for a long period of time even in a high-temperature environment, to which the seed crystal holder is exposed. Accordingly, a seed crystal can be held safely and reliably, and a single crystal being grown can be pulled steadily. Even when a material that causes plastic deformation such as Al is used for the heat-resistant cushioning material, there can be obtained the same effect as that obtained in the case where the aforementioned felts are used.

In conventional seed crystal holders, since the contact between a seed crystal and a seed crystal holder is in the form of point contact, support of the seed crystal is incomplete. As a result, cracks may be generated in the seed crystal or in the seed crystal holder, resulting in breakage of the seed crystal or the seed crystal holder, which causes a drop of a single crystal being grown. In the present invention, since a heat-resistant cushioning material is provided between the seed crystal and the seed crystal holder in order to establish full-surface contact, the load of a single crystal is dispersed over the entire contact surfaces and stress concentration is avoided, so that the seed crystal can be held safely and reliably. Therefore, even when a single crystal having a large diameter and weight is grown under a seed crystal, the risk of the seed crystal being broken can be eliminated. As a result, a single crystal can be pulled stably and efficiently. Also, conventionally, when the same seed crystal is used repeatedly, the risk of the seed crystal breaking increases with the number of repetitions. In the present invention, however, provision of the heat-resistant cushioning material enables repeated use of a seed crystal with increased safety.

BRIEF DESCRIPTION OF THE DRAWINGS

FIGS. 1A–1D are vertical cross-sectional views showing examples of a seed crystal holder of the present invention, wherein FIG. 1A shows a chuck-type, FIG 1B shows a key lock type, FIG. 1C shows another example of the key lock type, and FIG. 1D shows still another example of the key lock type;

FIGS. 2A–2D are vertical cross-sectional views showing examples of conventional seed crystal holders, wherein FIG. 2A shows a chuck type, FIG. 2B shows a key lock type, FIG. 2C shows another example of the key lock type, and FIG. 2D shows still another example of the key lock type.

DESCRIPTION OF THE PREFERRED EMBODIMENTS

Figure 3:
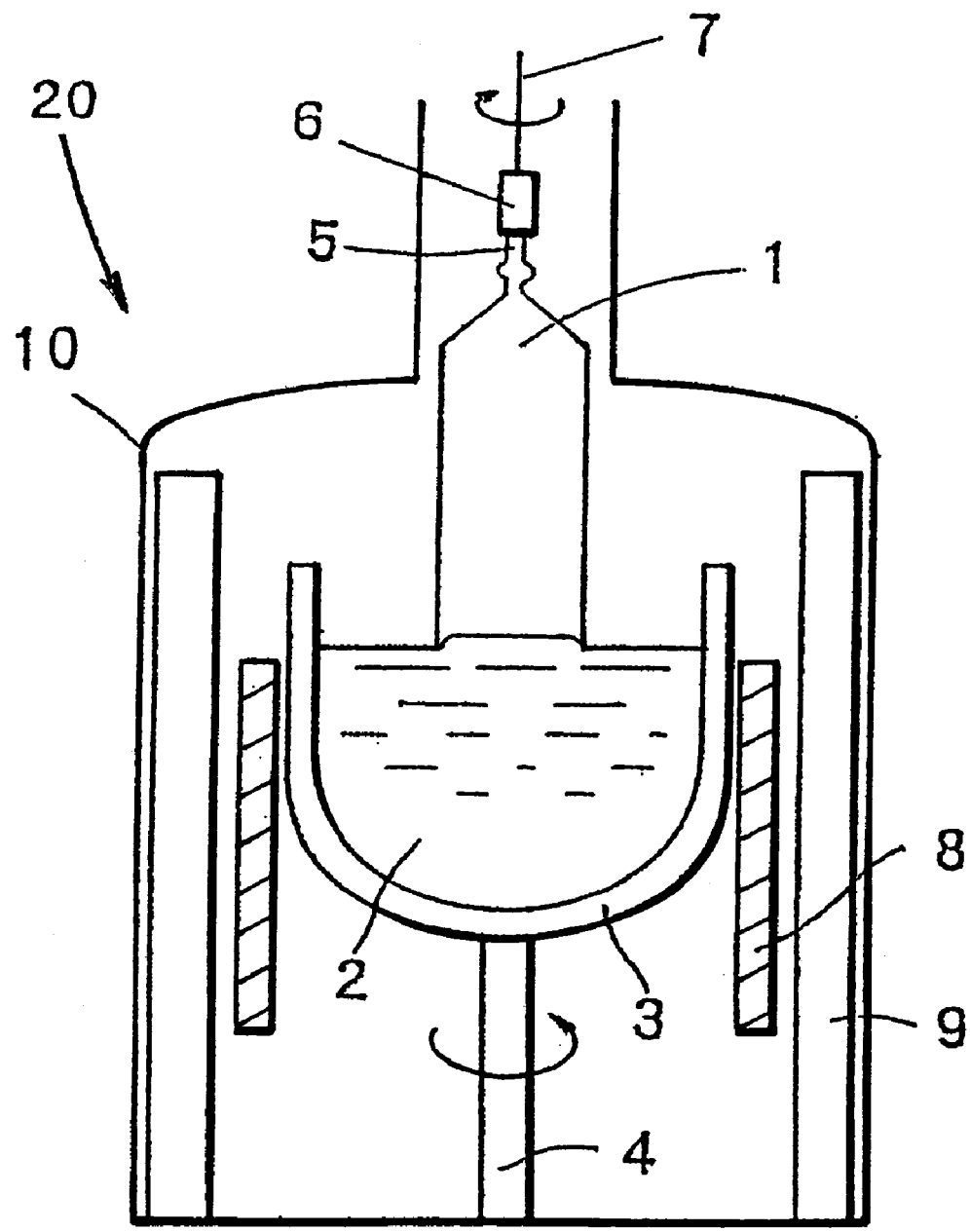
FIG. 3 is an explanatory diagram for showing an example of a crystal pulling apparatus in which a seed crystal holder of the present invention is used.

Embodiments of the present invention will next be described in detail, which, however, should not be construed as limiting the invention.

The inventors of the present invention investigated and studied the causes of an accident in relation to a seed crystal holder such that a seed crystal is broken while a single crystal is being pulled, and found that the main cause is incomplete contact between the contact surfaces of the seed crystal and the seed crystal holder. Through earnest studies, it was found that the above-described problem can be effectively solved when, in place of point contact, full-surface contact is established between the contact surfaces. The present invention has been completed on the basis of these findings.

First, with reference to the drawings, there will be described a seed crystal holding mechanism of a seed crystal holder of a crystal pulling apparatus to which the present invention is applied.

FIG. 1A is a vertical cross-sectional view of an example of a chuck type seed crystal holder of the present invention.

As shown in FIG. 1A, a chuck-type seed crystal holder 21 has a structure such that a heat-resistant cushioning material 23 is provided between the surface of a seed crystal 5 and the contact surfaces of a plurality of claws 22 of the chuck surrounding the seed crystal 5, in order to establish full-surface contact between the seed crystal 5 and the claws 22. When an outer sleeve 27 of the chuck is rotated to close or tighten the claws 22, the cushioning material 23 is pressed against the surface of the seed crystal 5. Accordingly, the seed crystal 5 can be held more reliably, so that a single crystal having a large diameter and weight can be pulled safely and reliably.

FIG. 1B shows an example of a key-lock-type seed crystal holder. The seed crystal holder 6 shown in FIG. 1B has a structure such that the seed crystal 5 is held through use of an insert 24. That is, the seed crystal 5 having a slanted cutaway surface is inserted into a bore formed at the center of the holder body; the insert 24 having a heat-resistant material 23 at the forward end thereof is inserted from a side of the holder 6 so that the insert 24 comes into contact with the slanted cutaway surface of the seed crystal 5; and a key 25 is then inserted into a key groove formed in the insert 24 to lock the insert 24. In the above-described structure, since the heat-resistant material 23 is interposed between the slanted cutaway surface of the seed crystal 5 and the contact surface of the insert 24, full-surface contact is established under pressure between the seed crystal 5 and the insert 24, so that the load of the single crystal is dispersed and stress concentration is mitigated. Accordingly, even when the seed crystal holder holds a heavy single crystal being grown, breakage does not occur from the portion of the seed crystal.

FIG. 1C shows another example of the key-lock-type seed crystal holder 6. The seed crystal holder shown in FIG. 1C is identical with the seed crystal holder of FIG. 1B in terms of structure and effects, including interposition of the heat-resistant cushioning material 23, except that a ring 26 having a tapered inner surface is fitted onto the tapered holder body of the seed crystal holder 6 from above in order to lock the insert 24.

FIG. 1D shows still another example of the key-lock-type seed crystal holder 6. In the seed crystal holder shown in FIG. 1D, the seed crystal 5 is engaged with the holder through use of an insert (pin) 24. That is, the seed crystal 5 is inserted into a bore formed at the center of the holder body of the cylindrical seed crystal holder 6; and an insert (pin) 24 is inserted from a side with respect to the seed crystal 5 so that the seed crystal 5 is engaged with the seed crystal holder 6. The surface of the seed crystal 5 with which the inserted insert 24 comes into contact is a curved contact surface which extends in a direction perpendicular to the vertical axis of the seed crystal and corresponding to a radially bisected portion of the circular cross section of the insert 24.

The heat-resistant cushioning material 23 is interposed to extend over at least the curved contact surface, thereby establishing surface contact. Thus, the load of a single crystal being grown is dispersed, and stress concentration is eliminated. Accordingly, a seed crystal and a single crystal being grown can be held safely and reliably.

The basic structure of a crystal pulling apparatus wherein a crystal seed holder of the present invention is used is essentially the same as that of the crystal pulling apparatus described in "Description of the Related Art" with reference to FIG. 3. However, as described in the four embodiments above, the use of the seed crystal holder of the present invention enables the seed crystal 5 to be held through surface contact rather than point contact, to thereby disperse the load of the single crystal and prevent stress concentration. Accordingly, a single crystal being grown having a large diameter and weight can be held safely and reliably, and the operation of pulling a single crystal can be performed stably for a longer term.

The heat-resistant cushioning material used in the present invention is selected from the group consisting of carbon fiber felt, glass fiber felt, metallic fiber felt, and ceramic fiber felt, which are strong enough to endure a high temperature environment in which the cushioning material is used and sustain the load of a heavy single crystal being grown.

The ceramic fiber contained in the ceramic fiber felt is selected from the group consisting of SiC fiber, BN fiber, $Si_3N_4$ fiber, AlN fiber, $Al_2O_3$ fiber, boron fiber, and silica-alumina fiber.

Examples of the metallic fiber contained in the metallic fiber felt include aluminum fiber, aluminum alloy fiber, steal fiber, and stainless steel fiber.

Such heat-resistant cushioning material that is selected from among the aforementioned heat-resistant fiber felts is capable of retaining its cushioning properties for a long period of time even in a high-temperature environment, to which the seed crystal holder is exposed. Accordingly, a seed crystal can be held safely and reliably, and a single crystal being grown can be pulled steadily.

The heat-resistant cushioning material used in the present invention may be suitably selected from among the aforementioned heat-resistant fiber felts according to purpose. However, when a silicon single crystal is pulled, carbon fiber felt, SiC fiber felt, or $Si_3N_4$ fiber felt is preferably selected in order to avoid contamination of a single crystal being grown and a silicon melt.

The term "felt" used herein refers to a non-woven fabric obtained by causing short fibers having a length of a few micrometers to a few millimeters to become entangled and then compressed. Alternatively, there may be used a woven fabric obtained by spinning short fibers into yarn and weaving the yarn into the fabric.

The heat-resistant cushioning material may be selected from among soft materials such as Al that easily cause plastic deformation and that are strong enough to endure a high temperature environment in which the cushioning material is used and sustain the load of a heavy single crystal being grown.

The present invention is not limited to the above-described embodiment. The above-described embodiment is a mere example, and those having the substantially same structure as that described in the appended claims and providing the similar action and effects are included in the scope of the present invention.

For example, in the above-described embodiments, descriptions have been given of the cases where the seed crystal holder of the present invention is used in the CZ method. However, needless to say, the seed crystal holder of the present invention can also be used in a so-called magnetic field applied Czochralski (MCZ) method.

What is claimed is:

1. A seed crystal holder used in a crystal pulling apparatus operated in accordance with the Czochralski method, wherein a heat-resistant cushioning material is provided between a surface of a seed crystal and a contact surface of claws of the holder or between a cutaway surface of a seed crystal and a contact surface of an insert of the holder.

2. A seed crystal holder according to claim 1, wherein said heat-resistant cushioning material is selected from the group consisting of carbon fiber felt, glass fiber felt, metallic fiber felt, and ceramic fiber felt.

3. A seed crystal holder according to claim 2, wherein said ceramic fiber contained in the ceramic fiber felt is selected from the group consisting of SiC fiber, BN fiber, $Si_3N_4$ fiber, AlN fiber, $Al_2O_3$ fiber, boron fiber, and silica-alumina fiber.

4. A seed crystal holder according to claim 1, wherein said heat-resistant cushioning material is selected from materials that cause plastic deformation.

* * * * *